US006191977B1

United States Patent
Lee

(10) Patent No.: US 6,191,977 B1
(45) Date of Patent: Feb. 20, 2001

(54) SENSE CIRCUIT FOR A MULTI-LEVEL FLASH MEMORY CELL

(75) Inventor: Jong Oh Lee, Kyungki-Do (KR)

(73) Assignee: Hyundai Electronics Industries Co., Ltd., Kyungki-do (KR)

( * ) Notice: Under 35 U.S.C. 154(b), the term of this patent shall be extended for 0 days.

(21) Appl. No.: 09/275,773

(22) Filed: Mar. 25, 1999

(30) Foreign Application Priority Data

Mar. 28, 1998 (KR) .................................................. 98-10862

(51) Int. Cl.$^7$ ................................................... G11C 16/06
(52) U.S. Cl. ............... 365/185.21; 365/205; 365/185.03; 365/185.2
(58) Field of Search ......................... 365/185.21, 185.03, 365/205, 185.2, 189.07

(56) References Cited

U.S. PATENT DOCUMENTS

| 5,539,690 | 7/1996 | Talreja et al. ..................... 365/185.22 |
| 5,687,114 | * 11/1997 | Khan ................................ 365/185.03 |
| 5,729,490 | * 3/1998 | Calligaro et al. ............... 365/185.03 |
| 5,768,187 | * 6/1998 | Uchino et al. ................... 365/185.03 |
| 5,768,188 | 6/1998 | Park et al. ....................... 365/185.03 |
| 5,768,193 | 6/1998 | Lee et al. ........................ 365/185.25 |
| 5,796,667 | 8/1998 | Sweha et al. ........................ 365/207 |
| 5,815,443 | 9/1998 | Sweha et al. ................... 365/189.05 |
| 5,822,256 | 10/1998 | Bauer et al. ......................... 365/200 |
| 5,828,601 | 10/1998 | Hollmer et al. ................... 365/185.2 |
| 5,828,616 | * 10/1998 | Bauer et al. ......................... 365/210 |

FOREIGN PATENT DOCUMENTS

| 06162787 | 11/1992 | (JP) . |
| 06176585 | 12/1992 | (JP) . |
| 06215585 | 1/1993 | (JP) . |
| 06251593 | 2/1993 | (JP) . |
| 10093054 | 9/1996 | (JP) . |
| 10228784 | 2/1997 | (JP) . |

* cited by examiner

Primary Examiner—Richard Elms
Assistant Examiner—Tuan T. Nguyen
(74) Attorney, Agent, or Firm—Pennie & Edmonds LLP

(57) ABSTRACT

A sense circuit for multi-level flash memory cell includes a control signal generator for generating a plurality of voltage control signals, a clock signal having constant period and a plurality of control pulses according to a sense amplifier enable signal; a control voltage generator for generating multi-steps voltage according to the clock signal and the plurality of voltage control signals, sequentially supplying the multi-steps voltage to a program gate of the memory cell, generating a reference voltage according to the sense amplifier enable signal and supplying the reference voltage to a program gate of a reference cell; and a sense amplifier for sequentially comparing a plurality of data stored in the memory cell and a data of the reference cell, storing the result according to the control pulse and converting it into binary data.

19 Claims, 4 Drawing Sheets

SENSE CIRCUIT FOR A MULTI-LEVEL FLASH MEMORY CELL

BACKGROUND OF THE INVENTION

1. Field of the Invention

The present invention relates to a sense circuit of a flash memory device and, in particular, to a sense circuit of a flash memory device which sense, according to a clock signal having a constant period and a plurality of control signal, data on a flash memory cell capable of storing multi-level, and transforms it to binary data.

2. Related Prior Art

In general, in case of sensing information stored in a memory cell, sensing is done by comparing an amount of current flowing through the memory cell and that flowing through the reference memory cell.

A conventional memory cell is designed to store only one data and also a sense amplifier sensing such cell is designed to sense only one data. However, there is a problem in that storing only one data to one cell requires a plurality of memory cells in proportion to the amount of data and degrades the high-density integration of a device. To solve such problem, a memory cell which can store multi-level is developed. Accordingly, the memory cell has become to be able to store one or more data, and development of a sense amplifier which can precisely sense data stored in such cell has become necessary.

SUMMARY OF THE INVENTION

Therefore, the object of the present invention is to provide a sense circuit of a flash memory device which can sense, according to a clock signal having a constant period and a plurality of control signals, data on a flash memory cell capable of storing multilevel, trans form it to binary data.

A sense circuit according to the present invention to accomplish the above described object comprises a control signal generator for generating a plurality of voltage control signals, a clock signal having constant period and a plurality of control pulses according to a sense amplifier enable signal, a control voltage generator for generating multi-steps voltage according to the clock signal and the plurality of voltage control signals, sequentially supplying the multi-steps voltage to a program gate of the memory cell, generating a reference voltage according to the sense amplifier enable signal and supplying the reference voltage to a program gate of a reference cell; and a sense amplifier for sequentially comparing a plurality of data stored in the memory cell and a data of the reference cell, storing the result according to the control pulse and converting it into binary data.

BRIEF DESCRIPTION OF THE DRAWINGS

The above object and other advantages of the present invention will become more apparent by describing in detail the preferred embodiment of the present invention with reference to the attached drawings in which.

Similar reference characters refer to similar parts in the several views of the drawings.

DETAILED DESCRIPTION OF THE INVENTION

The present invention will be described in detail with reference to the accompanying drawings.

Figure 1:
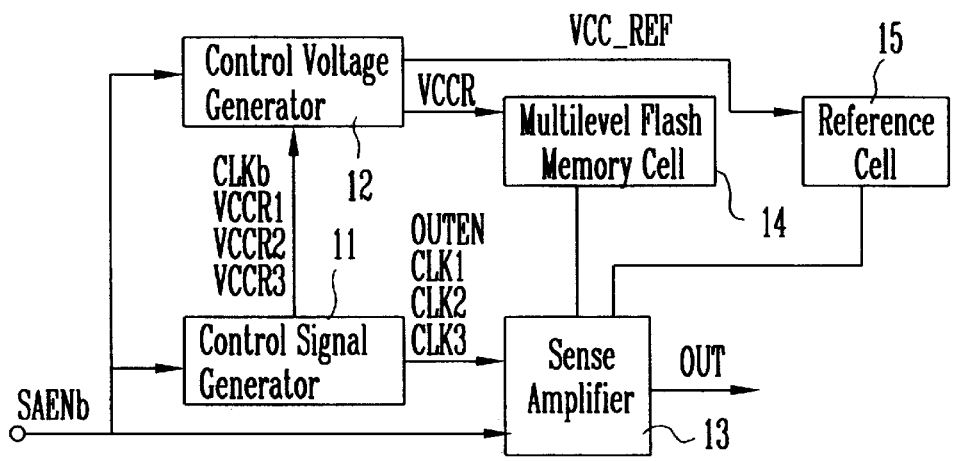
FIG. 1 is a block diagram showing a sense circuit for a multi-level flash memory cell according to the present invention.

FIG. 1 is a block diagram showing a sense circuit for multi-level flash memory cell according to the present invention.

A sense amplifier enable signal SAENb is input to a control signal generator 11 to read multi data stored on a multi-level flash memory cell 14. A clock signal CLKb having constant period, a first, a second and a third voltage control signals VCCR1, VCCR2 and VCCR3 generated by the control signal generator 11 are supplied to a control voltage generator 12. A first, second and third pulses CLK1, CLK2 and CLK3 and an output enable signal OUTEN generated by the control signal generator 11 are supplied to a sense amplifier 13. The control voltage generator 12 generates a reference voltage VCC_REF and a read-out voltage VCCR. The reference voltage VCC_REF is supplied to a program gate of a reference cell 15 and the read-out voltage VCCR is supplied to a program gate of the flash memory cell 14. The read-out voltage VCCR varies according the first to third voltage control signals. That is, according to the clock signal CLKb, the sequentially changed read-out voltage VCCR is supplied to the memory cell 14. The sense amplifier 13 sequentially compares the currents flowing through the memory cell 14 and the reference cell 15. The multi-data stored in the memory cell 14 is read out by this operation and converted into binary data.

Figure 2:
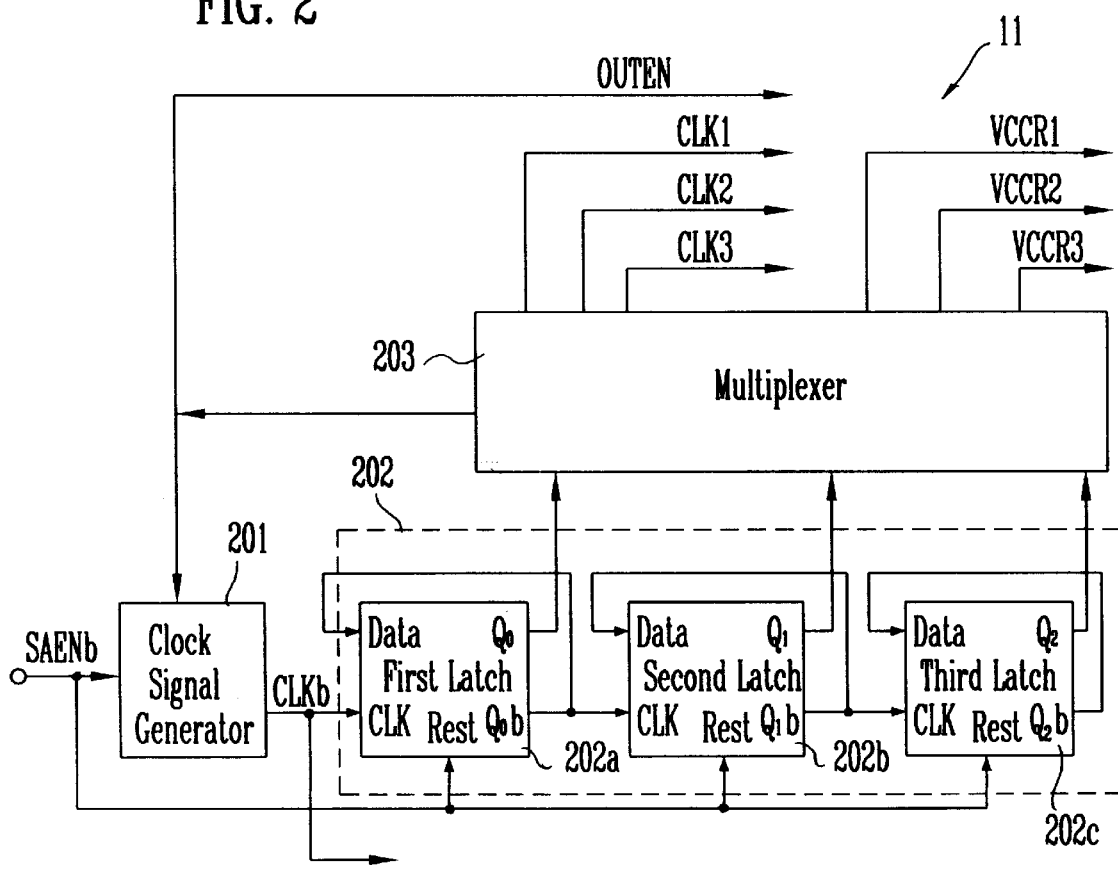
FIG. 2 is a detailed circuit diagram of a control signal generator FIG. 1.
Figure 3:
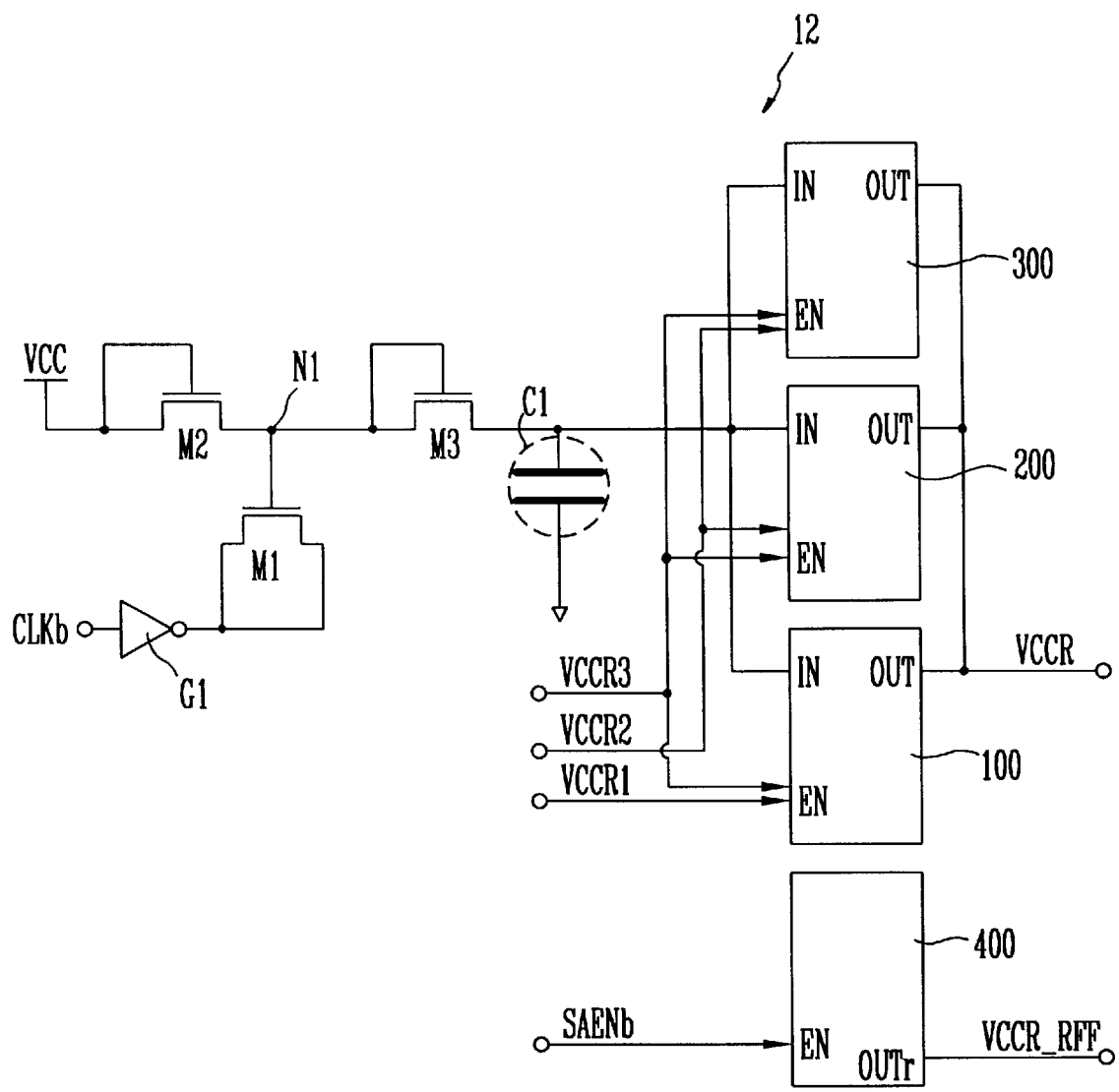
FIG. 3 is a detailed circuit diagram of a control voltage generator of FIG. 1.
Figure 4:
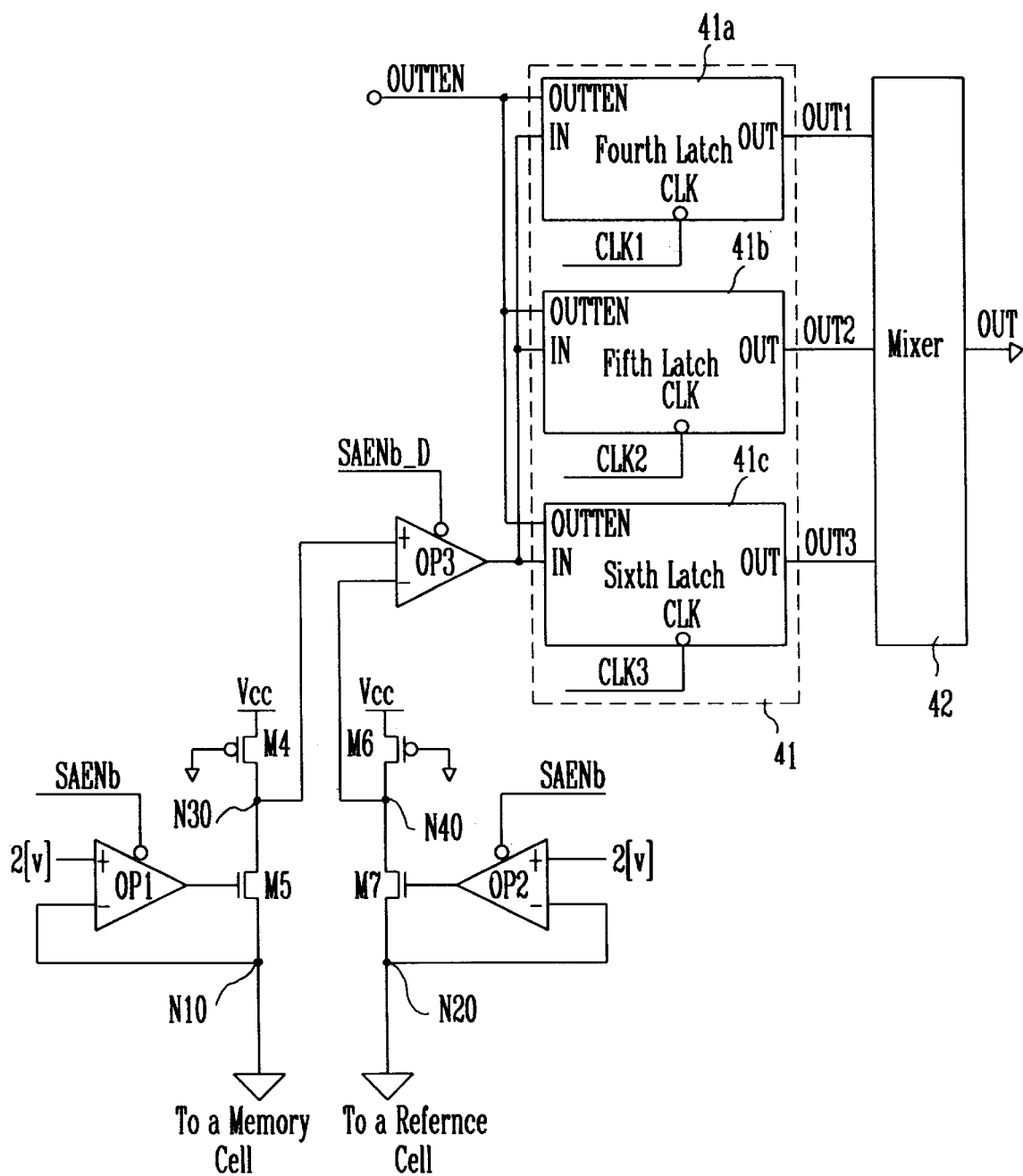
FIG. 4 is a detailed circuit diagram of a sense amplifier.

Referring to FIGS. 2 to 4, a case where three data are stored in one memory cell will be explained in detail.

FIG. 2 is a detailed circuit diagram of the control signal generator 11 of FIG. 1. The operation of FIG. 2 will be explained with reference to FIG. 5.

The clock signal CLKb generated by a clock signal generator 201 according to the sense amplifier enable signal SAENb is input to a clock terminal CLK of a first latch 202a of a clock signal counter 202. The clock signal counter 202 is composed of a first to third latches 202a to 202c, counts the clock signal CLKb and generates a plurality of output signals Q0, Q1 and Q2. The three output signals Q0, Q1 and Q2 generated by the clock signal counter 202 are input to a multiplexer 203. The multiplexer 203 sequentially outputs the signals CLK1 to CLK3, VCCR1 to VCCR3 and OUTEN as shown in Table 1.

TABLE 1

| Q0 | Q1 | Q2 | OUTPUT OF MULTIPLEXER |
|----|----|----|----|
| 1 | 0 | 0 | VCCR1 |
| 0 | 1 | 0 | VCCR1 and CLK1 |
| 1 | 1 | 0 | VCCR2 |
| 0 | 0 | 1 | VCCR2 and CLK2 |
| 1 | 0 | 1 | VCCR3 |
| 0 | 1 | 1 | VCCR3 and CLK3 |
| 1 | 1 | 1 | OUTEN |

FIG. 3 is a detailed circuit diagram of the control voltage generator of FIG. 1. The operation of FIG. 3 will be explained with reference to FIG. 5.

The clock signal CLKb is inverted by an inverter G1 and input to a first transistor M1 acting as a capacitor. The supply voltage VCC is supplied to a first node N1 via a second transistor M2. The first node N1 is boosted to a level higher than the supply voltage VCC according to the clock signal CLKb supplied through the first transistor M1. The boosted voltage is input to a first to third regulators 100 to 300 through a third transistor M3. A capacitor C1 is connected between the inputs of the regulators and the ground.

The first to third regulators 100 to 300 are enabled according the first to third voltage control signals VCCR1 to VCCR3. That is, if the first voltage control signal VCCR1 is at high state, the first regulator 100 is enabled, if the second voltage control signal VCCR2 is at high state, the second and third regulators 200 and 300 are enabled, and if the third voltage control signal VCCR3 is at high state, the first to third regulators 100 to 300 are enabled, so that an output node VCCR is applied with a first, second or third voltage VCR1, VCR2 or VCR3. In addition, a reference regulator 400 generates a stabilized reference voltage VCCR_REF according to the sense amplifier enable signal SAENb. The first, second or third voltage VCR1, VCR2 or VCR3 is supplied to the program gate of the memory cell 14 and the reference voltage VCCR_REF is supplied to the program gate of the reference cell 15.

FIG. 4 is a detailed circuit diagram of the sense amplifier of FIG. 1. The operation of FIG. 4 will be described in detail with reference to FIG. 5. A first operational amplifier OP1, which is enabled according to the sense amplifier enable signal SAENb and to for example a non-inverting terminal (+) of which the voltage of 2V is supplied, controls a fifth transistor M5 so that a node N10 maintains 2V. Similarly, a second operational amplifier OP2, which is enabled according to the sense amplifier enable signal SAENb and to for example a non-inverting terminal (+) of which the voltage of 2V is supplied, controls a seventh transistor M7 so that a node N20 maintains 2V. The fourth and sixth transistors M4 and M6 are always turned on since they are supplied with the supply voltage Vcc, and supply a constant current to the fifth and seventh transistors, respectively. The node N10 is connected to the drain of the memory cell 14, and the node N20 is connected to the drain of the reference cell 15, the sources of the two cells being grounded. As previously explained, since the constant reference voltage VCCR_REF is supplied to the program gate of the reference cell 15, a node N40 maintains the constant voltage. However, since the memory cell 14 is programmed to multi-level and the voltage supplied to the program gate thereof is variable, the potential of the node N30 varies according the program condition of memory cell 14. The potential difference between the node N30 and node N40 is finally compared at a third operational amplifier OP3. The output of the third operational amplifier OP3 is stored in one of the fourth, fifth and sixth latches 41a, 41b and 41c in latch block 41 according to the first to third pulses CLk1 to CLK3. The output of the third operational amplifier OP3 is stored to the fourth latch 41a in case the first clock CLK1 is at high state, to the fifth latch 41b in case the second clock CLK2 is at high state, and to the sixth latch 41c in case the third clock CLK3 is at high state. The data stored in the fourth, fifth and sixth latches 41a, 41b, 41c are input to a mixer 42 acting as an encoder according to the output enable signal OUTEN, then converted to binary data and output through the output terminal OUT.

Figure 5:
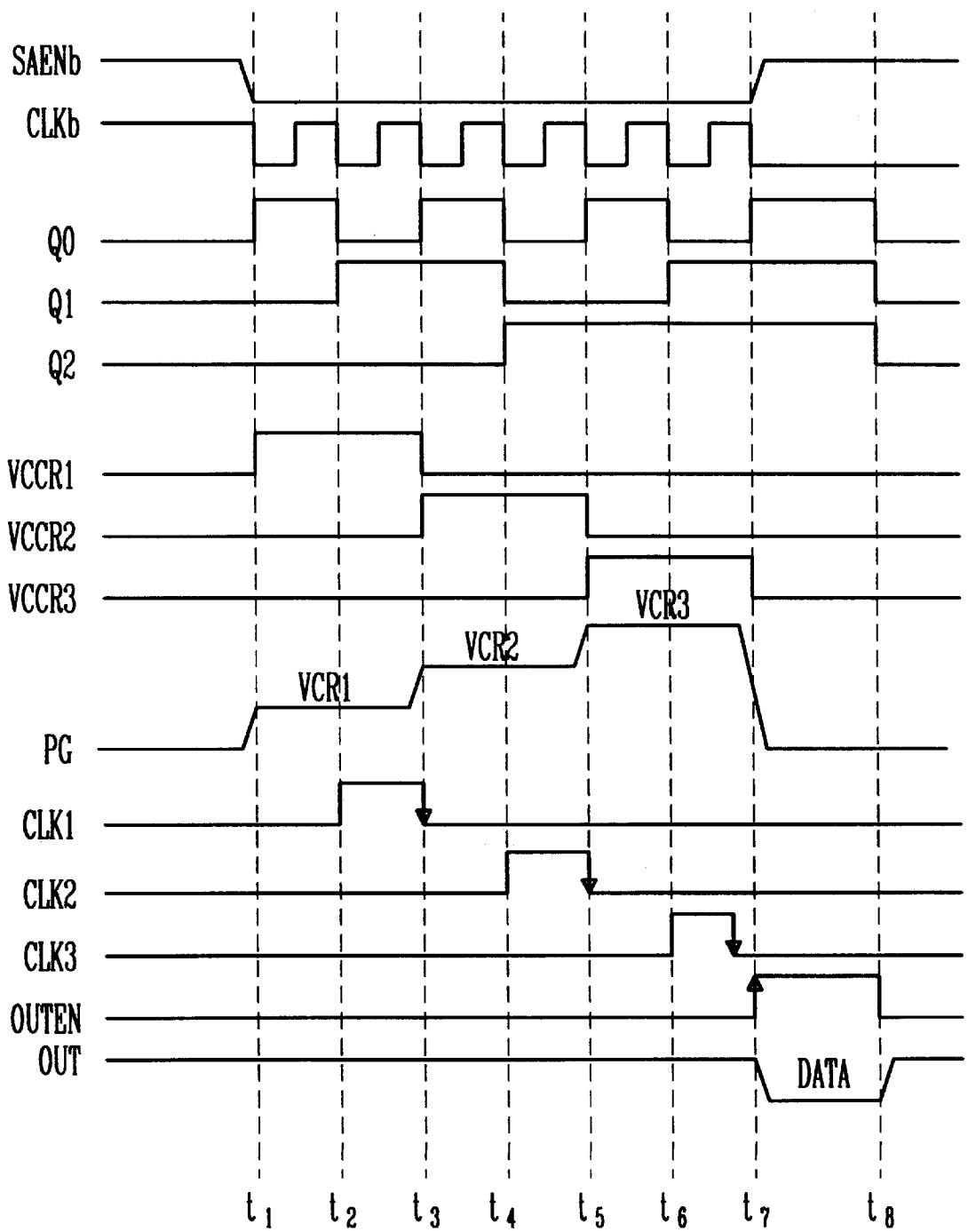
FIG. 5 is a waveform diagram to illustrate an operation of a sense circuit according to the present invention.

FIG. 5 is a waveform diagram to illustrate the operation of the sense circuit according to the present invention.

In the interval t1 to t2, as the sense amplifier enable signal SAENb becomes low state, the clock signal CLKb having a constant period is generated from the clock signal generator (201 of FIG. 2). The clock signal CLKb is input to the control signal generator(11 of FIG. 1) and the control voltage generator(12 of FIG. 1). The output terminal Q0 to Q2 of clock signal counter (202 of FIG. 2) in the control signal generator (11 of FIG. 1) to which the clock signal CLKb is input becomes for example "100". In this case, the multiplexer (203 of FIG. 2) outputs the first voltage control signal VCCR1. Therefore, since the first regulator 100 is enabled by the first voltage control signal VCCR1, the VCCR node becomes the first voltage VCR1. Accordingly, the potential of the program gate of the memory cell 14 becomes the first voltage VCR1.

In the period t2 to t3, if the clock signal counter (202 of FIG. 2) outputs '010', the multiplexer (203 of FIG. 2) outputs the first pulse CLK 1 and the second voltage control signal VCCR2. The fourth latch (41a of FIG. 4) is enabled by the first pulse CLK1. At this time, the program gate maintains the first voltage VCR1.

In the period t3 to t4, if the clock signal counter (202 of FIG. 2) outputs '110', the multiplexer (203 of FIG. 2) outputs the second voltage control signal VCCR2. Accordingly, the second and third regulators 200 and 300 of FIG. 3 are enabled, therefore, the VCCR node is boosted to the second voltage VCR2 higher than the first voltage. Therefore, the potential of the program gate PG of the memory cell 14 is boosted to the second voltage VCR2.

In the period t4 to t5, if the clock signal counter (202 of FIG. 2) outputs '001', the multiplexer (203 of FIG. 2) outputs the second voltage control signal VCCR2 and the second pulse CLK2. Accordingly, the fifth latch 41b of FIG. 4 is enabled and the second and third regulators 200 and 300 of FIG. 3 are enabled, therefore the VCCR node maintains the second voltage VCR2. Therefor, the potential of program gate PG of memory cell 14 maintains the second voltage VCR2.

In the period t5 to t6, if the clock signal counter (202 of FIG. 2) outputs '101', the multiplexer (203 of FIG. 2) outputs the third voltage control signal VCCR3. Therefore, since the first, second and third regulators 100, 200 and 300 of FIG. 3 are enabled, the VCCR node is boosted to the third voltage VCR3 higher than the second voltage. Therefore, the potential of the program gate PG of the memory cell 14 is boosted to the third voltage VCR3.

In the period t6 to t7, if the clock signal counter (202 of FIG. 2) outputs '011', the multiplexer (203 of FIG. 2) outputs the third voltage control signal VCCR3 and the third pulse CLK3. Accordingly, since the sixth latch 41c of FIG. 4 is enabled and the first, second and third regulators 100, 200 and 300 of FIG. 3 are enabled, the VCCR node maintains the third voltage VCR3. Therefore, the potential of program gate PG of the memory cell 14 maintains the third voltage VCR3.

In the period t7 to t8, the sense amplifier enable signal SAENb is in high state and no more clock is generated. At this time, the clock signal counter (202 of FIG. 2) outputs data '111' and the multiplexer 203 outputs the output enable signal OUTEN. According to the output enable signal OUTEN, the data of the fourth to sixth latches (41a to 41c of FIG. 4) are input to the mixer (42 of FIG. 4). Now the program gate of the memory cell returns to the potential condition which was initially maintained, and the data which is input to the mixer (42 of FIG. 4) is converted to binary data.

Effect of the Invention

As described above, the present invention has the effect that it can raise the degree of integrity and precisely sense the data stored in cell by sensing in multi-step a plurality of data stored in memory cell which can store multi-level, mixing it, converting it into binary data and outputting it.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A sense circuit for a multi-level flash memory cell comprising:
    a control signal generator for generating a plurality of voltage control signals, a clock signal having constant period and a plurality of control pulses according to a sense amplifier enable signal;
    a control voltage generator for generating multi-steps voltage according to said clock signal and said plurality of voltage control signals, sequentially supplying said multi-steps voltage to a program gate of said multi-level flash memory cell, generating a reference voltage according to said sense amplifier enable signal and supplying said reference voltage to a program gate of a reference cell; and
    a sense amplifier for sequentially comparing a plurality of data stored in said memory cell and a data of said reference cell, storing the result according to said control pulse and converting it into binary data.

2. The circuit of claim 1, wherein said control signal generator comprises:
    a clock signal generator for generating a clock signal having constant period;
    a clock signal counter for counting a number of pulses output from said clock signal generator; and
    a multiplexer for selectively outputting a plurality of voltage control signals, a plurality of clock signals and a plurality of control pulses according to the output of said clock signal counter.

3. The sense circuit of claim 1, wherein said control voltage generator comprises:
    a means for generating a voltage boosted according to said clock signal having constant period;
    a plurality of regulators supplied with said boosted voltage, having the output terminals connected to each other, and for generating multi-steps voltage by being selectively enabled according to said voltage control signals; and
    a reference regulator for generating a reference voltage according to said sense amplifier enable signal.

4. The sense circuit of claim 1, wherein said sense amplifier comprises:
    a sense means for sensing each data stored in said memory cell and data of said reference cell by sequentially comparing them;
    a latch means for storing each of said plurality of data sensed through said sense means and outputting each stored data according to one of said control pulses output from said control signal generator; and
    a mixer for mixing data output from said latch means and converting them into binary data.

5. A sense circuit for a multi-level flash memory cell having a drain, a source and a program gate, the sense circuit comprising:
    a first means for supplying multi-steps voltage;
    a reference voltage; and
    a second means for sensing data stored in said memory cell, wherein the data are sensed by sequentially comparing voltages detected from the drain of said memory cell and said reference voltage under a drain voltage is applied to said drain, a ground voltage is applied to said source and said multi-steps voltage are sequentially applied to the program gate, and converting said compared results.

6. The sense circuit of claim 5, wherein said first means comprises:
    a control signal generator for generating a plurality of voltage control signals, a clock signal having constant period and a plurality of control pulses according to a sense amplifier enable signal; and
    means for generating said multi-steps voltage according to said clock signal and said plurality of voltage control signals, and supplying said multi-steps voltage to said program gate of said memory cell.

7. The sense circuit of claim 6, wherein said control signal generator comprises:
    a clock signal generator for generating the clock signal having constant period;
    a clock signal counter for counting a number of pulses output from said clock signal generator; and
    a multiplexer for selectively outputting a plurality of voltage control signals, a plurality of clock signals and a plurality of control pulses according to the output of said clock signal counter.

8. The sense circuit of claim 6, wherein said means comprises:
    a means for generating a voltage boosted according to said clock signal having constant period; and
    a plurality of regulators supplied with said boosted voltage, having output terminals connected to each other, and for generating said multi-steps voltage by being selectively enabled according to said voltage control signals.

9. The sense circuit of claim 6, wherein said second means comprises:
    a sense means for sensing each data stored in said memory cell and data of a reference cell by sequentially comparing them,
    a latch means for storing said data sensed through said sense means and outputting each stored data according to one of said control pulses output from said control signal generator; and
    a mixer for mixing data output from said latch means and converting the data output from said latch means into binary data.

10. A sense circuit for a multi-level flash memory cell having associated therewith a reference cell, the sense circuit comprising:
    a control signal generator configured to receive a sense amplifier enable signal and output a first plurality of voltage control signals, a clock signal having a constant period and a second plurality of control pulses;
    a control voltage generator configured to receive said first plurality of voltage control signals, said clock signal and said sense amplifier enable signal, and output a read-out signal having a variable voltage level which depends on said first plurality of voltage control signals, and a reference voltage; and
    a sense amplifier configured to receive said second plurality of control pulses, first data from a drain of said multi-level flash memory cell and second data from a drain of said reference cell and output a result of a comparison of said first data with said second data, in binary form.

11. The sense circuit according to claim 10, wherein the sense amplifier compares the first and second data for each of a plurality of voltage levels of said read-out signal.

12. The sense circuit according to claim 10, wherein
the variable read-out voltage is applied to the program gate of the flash memory cell;
the reference voltage is applied to a program gate of the reference cell; and
sources of said flash memory cell and said reference cell are both grounded.

13. The sense circuit according to claim 10, wherein the sense amplifier comprises:
a plurality of latches, each latch being clocked by a corresponding one of said second plurality of control pulses.

14. The sense circuit according to claim 13, wherein the sense amplifier is further configured to store a result of said comparison according to an active state of one of said control pulses.

15. The sense circuit according to claim 10, wherein the control signal generator comprises:
a clock signal generator configured to output the clock signal;
a clock signal counter configured to count a number of pulses output by the clock signal generator; and
a multiplexer configured to selectively output one of said first plurality of voltage control signals and selectively output one of said second plurality of control pulses, in response to a count of said clock signal counter.

16. The sense circuit according to claim 10, wherein the control voltage generator comprises:
a first circuit configured to generate a voltage boosted to a level higher than a supply voltage, according to said clock signal;
a plurality of regulators each having an input connected to said boosted voltage and being selectively enabled according to said voltage control signals, the plurality of regulators having their outputs connected to one another so as to jointly output a read-out signal having a variable voltage level; and
a reference regulator configured to generate a reference voltage according to said sense amplifier enable signal.

17. In a flash memory device comprising at least one multi-level flash memory cell having associated therewith a reference cell, the improvement comprising a sense circuit including:

a control signal generator configured to receive a sense amplifier enable signal and output a first plurality of voltage control signals, a clock signal having a constant period and a second plurality of control pulses;
a control voltage generator configured to receive said first plurality of voltage control signals, said clock signal and said sense amplifier enable signal, and output a read-out signal having a variable voltage level which depends on said first plurality of voltage control signals, and a reference voltage; and
a sense amplifier configured to receive said second plurality of control pulses, first data from a drain of said multi-level flash memory cell and second data from a drain of said reference cell and output a result of a comparison of said first data with said second data, in binary form.

18. A sense circuit for a multi-level flash memory cell having associated therewith a reference cell, the multi-level flash memory cell and the reference cell each having a program gate, a source and a drain, the sense circuit comprising:
a first circuit configured to output a read-out signal having a variable voltage level and a reference voltage; and
a second circuit configured to sense data stored in said flash memory cell by comparing voltage outputs at drains of said flash memory cell and said reference cell, and then output said data in digital form, wherein
the read-out signal is connected to a program gate of the flash memory cell so as to successively apply a plurality of voltage levels thereto;
the reference voltage is connected to a program gate of reference memory cell;
the sources of the flash memory cell and the reference cell are grounded; and
a comparison of the voltage outputs is made for each of said plurality of voltage levels to read the data stored in said flash memory cell.

19. The sense circuit according to claim 18, wherein the first circuit comprises:
a control signal generator configured to receive a sense amplifier enable signal and output a first plurality of voltage control signals, a clock signal having a constant period and a second plurality of control pulses; and
a control voltage generator configured to receive said first plurality of voltage control signals, said clock signal and said sense amplifier enable signal and output said read-out signal, a voltage of said read-out signal depending on said first plurality of voltage control signals.

* * * * *